United States Patent [19]

D'Ottavio et al.

[11] Patent Number: 5,004,672

[45] Date of Patent: Apr. 2, 1991

[54] ELECTROPHORETIC METHOD FOR APPLYING PHOTORESIST TO THREE DIMENSIONAL CIRCUIT BOARD SUBSTRATE

[75] Inventors: Eugene D. D'Ottavio, Sudbury; Robert E. Hawkins, Northboro; Stephen S. Rodriguez, Monument Beach; James Rychwalski, Medway, all of Mass.

[73] Assignee: Shipley Company Inc., Newton, Mass.

[21] Appl. No.: 377,123

[22] Filed: Jul. 10, 1989

[51] Int. Cl.$^5$ .......................... G03C 1/68; G03C 5/00
[52] U.S. Cl. .................................. 430/314; 430/319; 204/181.1; 427/98

[58] Field of Search .......................... 204/181; 427/98; 430/314

[56] References Cited

U.S. PATENT DOCUMENTS 4,238,385 12/1980 Okado et al.
4,592,816 6/1986 Emmons et al.
4,671,854 6/1987 Ishikawa et al.
4,751,172 6/1988 Rodriguez .......................... 430/314

*Primary Examiner*—David Welsh
*Attorney, Agent, or Firm*—Robert L. Goldberg

[57] ABSTRACT

A process for manufacturing a 3-dimensional circuit board by electrophoretic deposition whereby (a) providing the board with a conductive surface and (b) applying a photoresist by electrophoretic deposition.

5 Claims, No Drawings

ELECTROPHORETIC METHOD FOR APPLYING PHOTORESIST TO THREE DIMENSIONAL CIRCUIT BOARD SUBSTRATE

BACKGROUND OF THE INVENTION

1. Field of the Invention

The present invention relates to a method for preparing a circuit board having 3-dimensional features by electrodeposition. More specifically, the invention is directed to the application of a uniform coating of a photoresist to a metallized substrate having 3-dimensional features.

2. Description of the Prior Art

Injection-molded circuit boards having 3-dimensional features are providing new ways of connecting and mechanically retaining electrical components. Injection molding has proven to be a very cost effective production technique for large volumes of identical precision parts. Thermoplastic resins are easily processed on conventional injection molding equipment, thus taking advantage of the economics of this process.

Three-dimensional circuit boards are not a direct substitution for a conventional planar circuit board. Instead, they are an integration of circuitry, wiring, hardware and physically structure into a one-piece consolidation.

Applications of injection-molded 3-dimensional circuit boards are only limited by the imagination of the electronics industry. Typically, applications include telecommunications, electronic toys and games, automotive, personal computers, to name a few.

Unlike the conventional flat board, the molded circuit board can take on almost any desired shape, and the circuit can be placed almost anywhere desired. Molding these circuit boards out of high temperature thermoplastic substrates such as polyetherimide (PEI) and polyethersulfone (PES) (which are generally filled with glass fibers and or mica) allows soldering without significantly affecting the dimensional stability of the substrate.

One approach for manufacturing 3-D boards involves two steps. In step one, a catalyzed resin containing palladium is injection molded. In a second step, a non-catalyzed resin is selectively injected over the molded form of step one to define the circuitry. While this approach does away with the use of conventional masks to define the circuitry, the process is very expensive and inflexible in that circuitry lines cannot be modified or changed except by creating entirely new molds.

Another approach to preparing 3-dimensional circuit boards involves injection molding followed by metallization, typically with copper. Following metallization a circuit image is formed by coating the copper layer with an organic coating material. The organic coating material may be either a screen resist or a photoresist. Using a screen resist, the image is formed during the coating process such as by silk screening. Using the photoresist the coating is applied as a single unitary coating by spraying, dipping, spin coating, etc. The photoresist film is then exposed to activating radiation in a desired circuit image and the exposed coating is developed with a liquid developer capable of differentiating light exposed areas from areas that have not been light exposed and dissolving one or the other dependent upon whether the photoresist is a positive or a negative photoresist. Examples of suitable photoresist materials are disclosed in U.S. Pat. Nos. 4,093,461; 4,148,654; and 4,339,516 incorporated herein by reference.

Development of a photoresist bares the underlying metal layer on the surface of the substrate. The metal layer may then be reinforced by electroplating a metal such as copper thereon, which copper comprises the circuit pattern of the finished board. The photoresist used in the process must be able to withstand attack by the electroplating bath. The remaining copper must then be removed to form the circuit. This may be accomplished by electroplating a dissimilar metal over the copper such as solder, immersion tin, gold or a tin nickel alloy. The organic coating in an image pattern permits deposition of the etch resistant metal. The organic coating is then removed with a solvent to bare the remainder of the copper layer. Such solvents are known in the art and may include aqueous formulations dependent upon the photoresist used to define the image pattern. The copper layer is dissolved by contact with an etchant which dissolves exposed copper but does not aggressively attack the etch resistant metal and therefore does not attack the copper protected by the etch metal. Consequently, the etching step permanently alters the surface of the substrate i.e., by removing exposed copper by etching.

A final step in the fabrication of a board may involve stripping (dissolving) the etch resistant metal from the board leaving the desired circuit pattern. A processing sequence such as that discussed above is set forth in Coombs, *Printed Circuit Handbood*, McGraw Book Company, New York, 1979, chapters 6 and 7, incorporated herein by reference.

Liquid-type photoresists typically contain a combination of a film forming resin or polymer and a photosensitive compound or a photoinitiator dissolved or suspended in a solvent such as an organic liquid.

Liquid-type photoresists can be negative-acting or positive-acting systems. In the case of a negative-acting photoresist or negative resist, after the film is deposited on a surface and the solvent is removed as by heating, the film is selectively exposed, typically through a photomask, to a source of energy, such as ultraviolet light. The photomask has areas that are opaque and other areas that are transparent to the exposing radiation. The pattern on the photomask formed by the opaque and transparent areas defines the desired image, such as, a circuit, which is to be transferred to the substrate surface. The exposed portions of a negative resist film become less soluble in a developing solution, as the result of a photochemical reaction between the photoinitiator and the polymer or resin upon exposure, than the unexposed portions. This difference in solubility allows for the selective removal of the unexposed film and the transfer of the image to the surface. In a positive resist, the exposed portions of the film become more soluble in the developer than the unexposed portions, as a result of the photochemical reaction, allowing for the selective removal of the exposed areas. After either type of resist film is developed, the portions of the surface that are not protected by the resist may be etched, such as by the action of an oxidizing solution typically containing an inorganic acid. The remaining resist film may then be stripped from the surface leaving only the desired etched image on the substrate. Alternatively, the substrate surface containing the imaged resist can be plated with a metal or combination of metals, such as, tin or tin-lead alloy. The resist may then be selectively stripped and the exposed metal on the substrate may be etched to form the desired pattern or circuit on the substrate surface. The historical background, types and operation of conventional photoresists is described in Photoresist Material and Processes, W. D. DeForest, McGraw-Hill, 1975.

Although liquid-type resists have been used for many years in lithographic and electronic applications, and despite numerous improvements to the resist systems and processing steps involved with their use, these conventional liquid resists still suffer from one or more disadvantages. The most widely recognized drawback of liquid resists, however, has been difficulty to deposit films of uniform and adequate thicknesses on surfaces without the formation of voids or pinholes. For 3-dimensional boards, this is also the case, particularly at holes and corners, which leads to different exposure and developing times and often results in defective products.

Another type of photoresist is referred to as dry film. While dry film resists have been found used in the preparation of 2-dimensional boards, they do not lend themselves to application in 3-dimensional systems because dry film is generally applied using heat and pressure with pinch rollers which do not readily conform to a grossly 3-dimensional features.

SUMMARY OF THE INVENTION

The present invention relates to a method for preparing a 3-dimensional circuit board by application of a uniform coating of a photoresist to a metallized substrate by electrodeposition. In one preferred process the invention comprises the steps of contacting the surface of a 3-D board with an adhesion promotion agent, metallizing the surface to render it conductive and applying a photoresist composition to the metallized surface by electrophoretic deposition.

The above process may include additional process steps at any point in the process. More complete representative processes will be described below.

DETAILED DESCRIPTION OF THE INVENTION

This invention pertains to processes using electrophoretic deposition and more particularly, to processes using electrophoretic deposition that involve the permanent modification and alteration of the conductive surface of a 3-dimensional circuit board.

The term "conductive surface" as used herein means any surface possessing sufficient conductivity to permit electrophoretic deposition of an organic coating composition. Metal surfaces are preferred. Typically metals contemplated include, without limitation, copper, nickel, aluminum, titanium, etc. For the manufacture of printed circuits, the conductive surface would typically comprise a copper layer over a dielectric base material such as epoxy, polyimide, tetrafluoroethylene, PES, PEI and the like.

Permanent alteration or modification of the conductive surface, as contemplated herein, means treatment in a manner that permanently alters the surface such as by etching with an etchant to remove metal, chemical treating such as by oxidizing to form a plating solution, etc. A process involving etching would find utility in chemical milling and in the fabrication of printed circuit boards.

Electrophoretic deposition involves a process of electrophoresis which is the motion of charged particles through a liquid medium under the influence of an applied electrical field. The deposition is conducted in a cell with the conductive surface to be coated serving as one electrode. Charged polymer in a liquid medium is electrophoretically deposited on an oppositely charged electrode. Deposition of a positively charged polymer on a cathode is referred to as cataphoresis while deposition of a negatively charged polymer on a positively charged anode is known an anaphoresis.

Electrophoretic deposition of photoresist coatings is known. U.S. Pat. No. 3,738,835 describes the use of anaphoresis to deposit a photosensitive composition of polychloroprene polymer and a photosensitizer such as 4,4, -bis (dimethylamino) - benzophenone in a mixed organic solvent. Upon exposure of the photosensitive composition to radiation, the unsaturated polymer cross-links and the unexposed film is developed with an organic solvent. U.S. Pat. Nos. 3,954,587; 4,029,561, 4,035,273; 4,035,274; 4,039,414, 4,066,523; 4,070,258; and 4,166,017 also disclose coatings that are applied electrophoretically and exposed to activating radiation.

Japanese Patent Disclosure 55 (1980) -14849, entitled "Method For Preparing Printed Wiring Boards," discloses a process for electrophoretic deposition of a light sensitive organic coating in the manufacture of circuit boards. The process comprises forming plated through holes in a copper clad circuit board base material, electrophoretically depositing an organic resist onto the surface of the printed circuit board, exposing and developing the electrophoretically deposited film to form an image pattern, etching exposed copper, and removing the electrophoretically deposited film. In effect, the patent teaches that electrophoretically deposited photoresist is used in the same way as photoresist applied by conventional means in the manufacture of printed circuit boards.

The first step in the process of the present invention is the preparation of the 3-D substrates by an adhesion promotion process. This process facilitates metallizing of the substrate with, copper, nickel etc. Such adhesion promotion processes are well known in the art. See, e.g., U.S. Pat. Nos. 4,515,829, 3,668,130 and 3,708,430, the disclosures of which is incorporated by reference herein. This process provides a roughened surface necessary for proper adhesion of the subsequently applied metal layer to the substrate. Other processes in which metallization occurs, at least in part, by chemical bonding may also be employed in practicing the present invention. One such process is described in U.S. Pat. No. 4,775,449, the disclosure of which is incorporated by reference herein.

The next step in the process comprises metallization of the prepared surface with a suitable metal such as copper, nickel, tin, and the like. Metallization of thermoplastic substrates are well known in the art. Methods for metallization are disclosed in U.S. Pat. Nos. 3,011,920, 4,634,619, 4,600,656. In one preferred embodiment, the thermoplastic substrate is processed through an electroless copper process which comprises the steps of:

(a) conditioning the dielectric layer to promote absorption of the catalytic material;

(b) catalyzation, e.g., by deposition of a $PdCl_2$ colloid onto the conditioned substrate:

(c) acceleration, e.g., by removal of the tin sheath to expose the underlying Pd layer; and (d) metal deposition (e.g., copper) to form a continuous layer.

For a print and etch process, the metallized substrate is electroplated with the same or different metal to achieve the desired thickness. For 3-D molded circuit boards, the desired thickness is between about 10 $\mu$ and 75 $\mu$, preferably between about 25 $\mu$ and 50 $\mu$, and most preferably between 35 $\mu$ and 45 $\mu$.

One alternative approach in the print and etch process is the substitution of the electroplating step with a full build approach, the entire conductive surface is generally built up with a metal layer by electroless deposition. This process normally takes several hours as compared with the print and etch approach in which the metal layer is applied in a matter of minutes.

In a print and plate process, discussed below, where the process is full build or additive, the preferred base metal which contacts the electrophoretically applied photoresist is nickel. It has been found that a thin overplate of nickel (e.g., from about 2 to 20 microinches) is particularly useful in promoting adhesion and preventing delamination of the resist in additive plating.

In the next step the metallized board is coated with an electrophoretic resist. Liquid photoresist compositions are used to form coatings from organic solutions which, when dried and exposed to light of the proper wavelength, are chemically changed in their solubility to certain solvents or developers. Two types are available: negative-acting and positive-acting. The negative acting resist is initially a mixture which is soluble in its developer but after light exposure, becomes polymerized and insoluble in developer. Exposure may be achieved in a number of ways as will be appreciated by the skilled artisan. For example, exposure is generally achieved by the use of an appropriate phototool containing opaque and transparent areas. See, e.g., DeForest, supra. Other imaging techniques, such as direct laser imaging, may also be employed to expose the photoresist. The unexposed resist is selectively dissolved, softened or washed away leaving the desired resist pattern on the substrate.

Positive-acting resists work in the opposite fashion: exposure to light causes the photoresist to become soluble in the developer. The resist image is frequently dyed to make it visible for inspection and retouching. Formulations for such photoresists are well known and they are typically formulated from materials such as vinyl cinnamate copolymers, as disclosed in U.S. Pat. Nos. 2,737,297; 2,739,892, and 2,801,233; benzal acetophenones as disclosed in U.S. Pat. Nos. 2,716,097 and 2,716,102; quaternary salts such as disclosed in U.S. Patent No. 2,908,667; azide polymers such as disclosed in U.S. Pat. No. 2,948,610; and naphthoquinone diazide esters and amides as disclosed in U.S. Pat. Nos. 3,634,082; 4,148,654 and 4,439,516, all incorporated herein by reference.

As described above, and as will be further described below, the photoresist can be applied by electrophoretic deposition over a conductive surface. Although either negative or positive acting photoresists may be employed, the use of a negative acting photoresist is described herein below for the sake of consistency. Following electrophoretic deposition of the resist coating, it is imaged and developed in a conventional manner.

Especially preferred electrophoretic coating compositions are those disclosed in U.S. Pat. No. 4,592,816 incorporated herein by reference. These compositions comprise aqueous solutions or emulsions of at least one polymer containing a carrier group, a photoinitiator and a source of unsaturation for a crosslinking reaction. The source of unsaturation includes monomers, polymers or both. As will be appreciated by the skilled artisan, other electrophoretic coating compositions can be employed in practicing the present invention. See, e.g., Japanese Patent Application No. 77-11601, EPO Publication Nos. 0198214 and 0204415, the disclosure of which are incorporated by reference herein.

The polymer component of the composition contains carrier groups that become positively or negatively charged upon contact with either an acid or a base, depending upon the specific carrier group employed. The carrier group is one selected so that a deposited film will be developable with an aqueous acid or aqueous base solution. Suitable polymers are addition and condensation polymers having the aforesaid carrier groups. Addition polymers having carrier groups prepared from monomers having ethylenic unsaturation are preferred. Polymers containing carrier groups that are useful in the photosensitive polymer composition include acrylic polymers, vinyl polymers other than acrylic polymers, epoxy polymers, polyurethanes, polyesters, and polyamides.

Polymers having positively charged carrier groups—i.e., or cataphoretic carrier groups, will deposit on a negatively charged electrode. Such carrier groups include, for example, quaternary ammonium groups, sulfonium groups and sulfoxonium groups. Other groups which become positively charged upon reaction with an acid, such as for example amine groups, may also be employed. The acids that are useful to protonate the carrier groups of the polymers include lactic acid, glycolic acid, hydroxyacetic acid, hydrochloric acid, formic acid, acetic acid and phosphoric acid.

Polymers having negatively charged carrier groups—i.e., anaphoretic carrier groups, will deposit on a positively charged electrode. Carboxylic acid groups are suitable negatively charged carrier groups.

For photoactive coatings, the preferred compositions suitable for electrophoretic deposition are formed by mixing the polymer containing carrier groups with at least one unsaturated monomer and a photoinitiator so that a polymer film electrophoretically deposited on a surface is capable of being polymerized into a cross linked polymer when exposed to actinic radiation. Monomers having two or more unsaturated groups attached to the same molecule are preferred. Most preferred are the multifunctional monomers having two or more acrylates or methacrylate groups attached to each monomer molecule. Examples of suitable monomers are set forth in the above referenced patent. Examples of photoinitiators suitable for use in the polymeric composition include the azo compounds, sulfur-containing compounds, metallic salts and complexes, oxines, amines, polynuclear compounds, organic carbonyl compounds, various quinones, etc. Specific examples of suitable photoinitiators are also set forth in U.S. Pat. No. 4,592,816.

In general, photosensitive polymeric compositions are formed by mixing the polymer solution with the unsaturated crosslinking monomer. The photoinitiator dissolved in a suitable solvent is then added to this solution, and the acid used to protonate the carrier groups is added to the stirred mixture. After the mixture is completely mixed, water is then added. The solids content of the emulsion can be adjusted by diluting the emulsion with additional water. The relative concentration of the polymer, photoinitiator, unsaturated monomer and acid for a cataphoretic polymer are illustrated in Table 1 where all components are expressed as a weight based on 100 parts of the polymer.

TABLE 1

|  | Overall | Preferred | Most Preferred |
|---|---|---|---|
| Polymer | 100 | 100 | 100 |
| Solvent | 0–300 | 0–100 | 11.0 |
| Unsaturated Monomer | 0–100 | 25–75 | 30–50 |
| Photoinitiator | 1–20 | 2–15 | 10–13 |
| Acid | 0.5–10 | 1–5 | 3.0 |
| Water | 400–4000 | 500–3100 | 800–2600 |

In order to promote uniform application of the photoresist to the metallized substrate, a coalescing or leveling agent is added to the photosensitive polymeric composition described in the aforesaid U.S. Pat. No. 4,592,816. These coalescing agents allow the film to better form during deposition and subsequent baking.

Preferred coalescing agents include both water soluble or partially water soluble and water insoluble agents. Of the water soluble or partially water soluble agents, the preferred agents include 1-nitropropane, 2-nitropropane, methyl pyrrolidone ethylene glycol ethyhexylether and propylene glycol methylether. Other coalescing agents include copolymers of ethyl acrylate such as Modaflow (Monsanto), oleyl alcohol and Texanol (2,2, 4-trimethyl 1,3 pentanediol monoisobutyrate) (Eastman Kodak) and surfactants such as Flexrecin (CasChem).

Preferably, the coalescing agent is added in conjunction with photoinitiators, dyes, inhibitors prior to emulsification (i.e., prior to addition of water in the above referenced U.S. Pat. No. 4,592,816.

The amount of coalescing agent employed may vary depending on a number of factors including the partition coefficient between the organic and aqueous phases. A good discussion of such factors is described in T. N. Visser, in Selecting Solvents For Electrodeposit Paints, FATIPEC, 18th (Vol. 1-B) at pages 367–394 (1986).

In general, for water soluble or partially water-soluble coalescing agents, the amount may be up to about 25% by weight of the emulsion (including both solids and the aqueous portion), preferably between about 10–20% by weight, and most preferably between about 14 and 18% by weight. For water insoluble coalescing agents, the amount may be up to about 15% by weight of solids used to form the emulsion, preferably between about 2–10% by weight, and most preferably between about 4–6% by weight.

Example 1 of U.S. Pat. No. 4,592,816 is a most preferred electrophoretically depositing composition for purposes of the invention, having included therein about 15% by weight of a coalescing solvent such as propylene glycol monomethyl ether.

In certain preferred embodiments stabilizing agents are added to the emulsion. Stablizing agents have been found to prevent premature crossliking of the monomers or polymers or both. Suitable stabilizing agents include hydroquinine, phenothiazine, methoxy hydroquinine and tert-butyl catechol. The amount of stablizing agent employed will vary depending on a number of factors including the operating temperature and degree of mechanical shear experienced by the emulsion during deposition. In general, the amount may be up to about 3.0% by weight of the emulsion solids, preferably between 0.1 and 0.7%, and most preferably between 0.3 and 0.5%.

Dyes may also be employed in order to enhance visual contrast and to facilitate inspection and subsequent repair (if necessary) when the photoresist is applied. Preferred dyes include the triarylmethane dyes such as methylviolet, the anthraquinones such as Oil Blue N and the like. The amount of dye generally depends on the thickness of the photoresist deposited. Typically the amount of dye used is less than about 1% by weight of the emulsion solids.

In the next step, the photoresist is imaged with desired artwork which defines the circuitry of the molded board by exposure of the photoresist and artwork to appropriate radiation such as ultraviolet light. Development of photoresists is well-known and described in DeForest, supra. One process for developing the photoresist involves the use of a dilute organic acid solution, such as the process described in the above-referenced U.S. Pat. No. 4,592,816 at columns 12–14.

The developed board may thereafter be etched in an appropriate solution until the background metal is removed. The remaining photoresist is then removed by methods well-known in the art (see, e.g. U.S. Pat. No. 4,592,816 at column 14 and Example 5).

A process for manufacturing of a printed 3-D molded board is more specifically described in the following examples where defined artwork is replicated on a 3-dimensional board with an electrophoretic resist.

EXAMPLE 1

In this example, a 3-dimensional board was used that was received with through holes and other 3-dimensional features.

Step 1: Preparation of a 3-D Molded Board

The molded board can be prepared by a sequence of steps including catalyzing the board with a tin-palladium colloid such as the Cataposit 44 (Shipley Company Inc. of Newton, Mass.) and electroless deposition of copper onto the dielectric substrate. An electroless copper plating solution such as CP-251 (Shipley Company Inc.) would be suitable for the depositon step. Times of immersion and conditions would be in accordance with the instructions supplied by the manufacturer of the materials used.

Step 2: Electrophoretic Deposition of Organic Coating Over Copper

One electrophoretic depositing composition is as follows:

Polymer 91.0 grams
Dimethylamino ethyl methacrylate (8 parts)
Methyl methacrylate (75 parts)
Ethyl acrylate (17 parts)
Dipentaerythritol monohydroxy penta-acrylate 46 grams
Dye (Morton ERO Blue from Morton Thiokol) 1.1 grams
Propylene glycol methylether 160 grams
Initiators (Irgacure 907 8.3 grams & isopropylthioxanthone 2.7 grams)
Lactic acid (20%) 15.0 grams
Distilled water to 1000.0 grams Typically, a portion of the above composition is added to a 250 ml. beaker used as a plating cell. A 1"×2" stainless steel plate is used as the anode and the circuit board base material is used as a cathode. The anode to cathode space was 2 inches. Bath temperature is maintained at about 22° C. A voltage of about 60 volts is applied across the electrodes and the voltage was applied for 10 seconds which is sufficient to deposit the electrophoretic coating over the copper surface.

Step 3: Image and Develop the Photoresist

To image and develop the photoresist, the 3-D molded board is exposed to U.V. radiation at about 200 mJ/cm² through a silver halide phototool to confer the desired pattern to the board. The board is thereafter developed by immersion in a 5% lactic acid solution containing a surfactant such as Triton X 100 at a temperature of about 25OC for a time sufficient to remove the unexposed photoresist.

Step 4: Electroplate Copper

The imaged and developed board is thereafter introduced into a acid-copper plating solution and current applied to electrolytically deposit the copper in the exposed area to a thickness of about 25 μ.

Step 5: Remove Electrophoretic Coating.

The electrophoretic coating is removed by immersion in a 30% lactic acid solution at 55° C. until all of the coating is removed.

Step 6: Etch Background Copper

Copper bared by removal of the photoresist film was removed by etching with a cupric chloride etchant for a time sufficient to remove all background copper.

In the following examples, any ingredients earmarked with an asterix ("*") are products obtained from Shipley Company, Inc., of Newton, Mass.

EXAMPLE 2

This example illustrates a subtractive method of producing a three dimensional printed wiring board.

Step 1: A molded board constructed of PES was submitted to the following adhesion promotion process:

The molded board was immersed in Hydrolyzer PM-940* at 160OF for about 2 mins. The board was then rinsed with water immersed in PM-921 (25% b.v.)*, (a solvent which promotes chemical attack by the chrome/sulfuric acid etch) at 120° F. for about 3 minutes. The board was again rinsed and thereafter etched in PM-940* (a chrome/sulfuric acid etch) at about 160° for about 3 minutes. After rinsing the board was immersed in PM-954*, a neutralizer, at about 120° F. for about 5 minutes and rinsed.

Step 2: Electroless Deposition of Copper

The board was immersed in an conditioning solution, Cleaner-Cond. 1175* at about 170° F. for about 5 minutes, then rinsed. The board was then immersed in Predip 404* at room temperature for about 2 minutes and transferred to a catalyst solution of Catalyst 44* at about 100° F. for about 5 minutes and rinsed. The board was then immersed in Accelerator 241* at about 115° F. for about 5 minutes and rinsed, and thereafter immersed in electroless copper Cuposit 251* at about 115° for 25 minutes and rinsed.

Step 3: The board was then electroplated in conventional acid copper solution to a final thickness of about 37 μ.

Step 4: The board was then coated with an electrophoretic resist described in Step 2 by immersing the board in a 4 liter beaker of the resist at about 80° F. for about 10 seconds at 90 volts. After coating the part was rinsed and baked for 5 minutes at 200° F.

Step 5: After cooling, the board was imaged with a silver halide phototool exposed to an ultraviolet light source at 300 mJ/cm².

Step 6: The board was then developed in a solution of 8% lactic acid containing 1% surfactant such as a modified polyethoxylated alcohol non-ionic surfactant. Development time was 5 minutes at 40° C. One preferred developer is Developer 6504*.

Step 7: The board was then etched in a cupric chloride etchant solution until background copper was removed.

Step 8: The remaining photoresist was removed by placing the part in a solution of 35% lactic acid containing 1% surfactant such as the above-described modified polyethoxylated alcohol non-ionic surfactant heated to a temperature of 85° C. Time for complete removal was 5 minutes.

EXAMPLE 3

A board was prepared substantially as described in Example 2 except that in this example copper was applied by an electroplate method, otherwise referred to as print-and-plate process.

Steps 1 and 2 were the same as described in Example 2.

Step 3: The board was then coated with the electrophoretic resist described in Step 2 by immersing the board in a 4 liter beaker of the resist at about 120° F. for about 10 seconds at 90 volts. After coating the part was rinsed and thereafter baked for 5 minutes at 200° F.

Step 4: After cooling, the board was imaged as above (Step 5).

Step 5: The board was developed as in Step 6 above.

Step 6: The board was then electroplated with an acid copper solution to a final thickness of 37 μ of copper.

Step 7: The photoresist was then stripped per Step 8 above.

Step 8: The background copper was then removed by immersing the board in a peroxide-sulfuric microetch (PE 746*).

EXAMPLE 4

A 3-D board was prepared by the full build or additive method as follows:

Steps 1 and 2 were the same as in Example 2.

Step 3: After applying electroless copper to the surface of the molded board, the board was immersed in Activator 472* for 1 minute at 70° F. After rinsing, the board was immersed in a PM 980* Electroless Nickel solution at 85° F. for 2 minutes.

Step 4: The board was then coated with an electrophoretic resist described in Step 2 by immersing the board in a 4 liter beaker of the resist at about 120° F. for about 10 seconds at 90 volts. After coating the part was rinsed and thereafter baked for 5 minutes at 200° F.

Step 5: The board was then developed as per Example 2, Step 6.

Step 6: The board was then placed in a 10% solution hydrochloric acid for 1 minute at room temperature. After rinsing the board was placed into a full build electroless copper bath for 12 hours at 130° F.

Step 7: After the additive copper had been deposited the resist was stripped as per Example 2, Step 8.

Step 8: The background nickel and copper was removed by placing the part in a peroxide-sulfuric microetch (PE 746*) until the dielectric was exposed.

We claim:

1. A process for forming a three dimensional circuit board comprising the steps of:
   (a) providing a molded three dimensional circuit board substrate free of metal on its surface;
   (b) metallizing the three dimensional surface of the circuit board substrate;

(c) building up the metallized surface with a metal selected from the group of copper, nickel, tin or mixtures thereof;
(d) electrophoretically applying a photoresist composition to the built up, metallized surface whereby photoresist is evenly deposited on all surfaces of the metallized surface;
(e) exposing and developing the photoresist in a desired image pattern;
(f) removing metal bared by development by contact with an etchant; and
(g) removing the remaining undeveloped photoresist.

2. The process of claim 1, wherein the metallized surface is built up by electroless deposition.

3. The process of claim 1, wherein the metallized surface is built up by electrolytic deposition.

4. A process for forming a three dimensional circuit board comprising the steps of:

(a) providing a molded three dimensional circuit board substrate free of metal on its surface;
(b) metallizing the three dimensional surface of the circuit board substrate;
(c) electrophoretically applying a photoresist composition to the metallized surface whereby photoresist is evenly deposited on all surfaces of the metallized surface;
(d) exposing and developing the photoresist in a desired image pattern;
(e) building up the metallized surface with a metal selected from the group of copper, nickel, solder, tin or mixtures thereof;
(f) removing the remaining undeveloped photoresist; and
(g) removing the metal bared by removal of the photoresist by contact with an etchant.

5. The process of claim 4, wherein the metallized surface is built up by electroless deposition.

* * * * *